United States Patent [19]

Beesley

[11] 4,334,317

[45] Jun. 8, 1982

[54] NOISE BLANKING CIRCUITRY IN A RADIO RECEIVER

[75] Inventor: Graham E. Beesley, Basingstoke, England

[73] Assignee: Motorola, Inc., Schaumburg, Ill.

[21] Appl. No.: 129,927

[22] Filed: Mar. 13, 1980

[30] Foreign Application Priority Data

Apr. 30, 1979 [GB] United Kingdom ............... 7914881

[51] Int. Cl.³ .......................................... H04B 1/10
[52] U.S. Cl. .................................. 455/194; 455/219; 455/224; 455/303
[58] Field of Search .............. 455/194, 212, 218, 219, 455/222, 223, 224, 225, 303, 311, 312; 307/350, 359

[56] References Cited

U.S. PATENT DOCUMENTS

| | | | |
|---|---|---|---|
| 3,064,196 | 11/1962 | Broadhead, Jr. | 455/219 |
| 3,323,066 | 5/1967 | Kurtz | 455/219 |
| 3,430,147 | 2/1969 | Hennessey | 455/219 |
| 3,699,457 | 10/1972 | Wright | 455/224 |

FOREIGN PATENT DOCUMENTS

| | | | |
|---|---|---|---|
| 2051891 | 10/1970 | Fed. Rep. of Germany | 455/224 |
| 2642755 | 3/1978 | Fed. Rep. of Germany | 455/224 |
| 2646104 | 4/1978 | Fed. Rep. of Germany | 455/223 |

Primary Examiner—Tommy P. Chin
Attorney, Agent, or Firm—Sang Ki Lee; Edward M. Roney; James W. Gillman

[57] ABSTRACT

A radio receiver including an RF amplifier stage arranged to receive transmitted RF signals and noise signals from an antenna, a mixer stage for converting the RF signals to intermediate frequency (IF) signals and supplying the IF signals to a blanker gate receiving blanking signals from a blanking signal source, the gate normally passing IF signals to discriminator means to demodulate the IF signals to audio signals, but decoupling the mixer stage from the demodulator when the blanking signal is present. The audio signal output from the discriminator is applied to a noise squelch circuit which detects noise frequencies above a predetermined frequency. If the predetermined frequency is exceeded, a squelch signal is generated to block or mute the audio signals. In the present invention, the squelch circuit employs an averaging detector instead of a peak detector in order to eliminate short duration spikes in the squelch circuit. The blanking signal generator circuit employs a tracking pulse detector which is immune to false triggering by maintaining the detector threshold.

9 Claims, 21 Drawing Figures

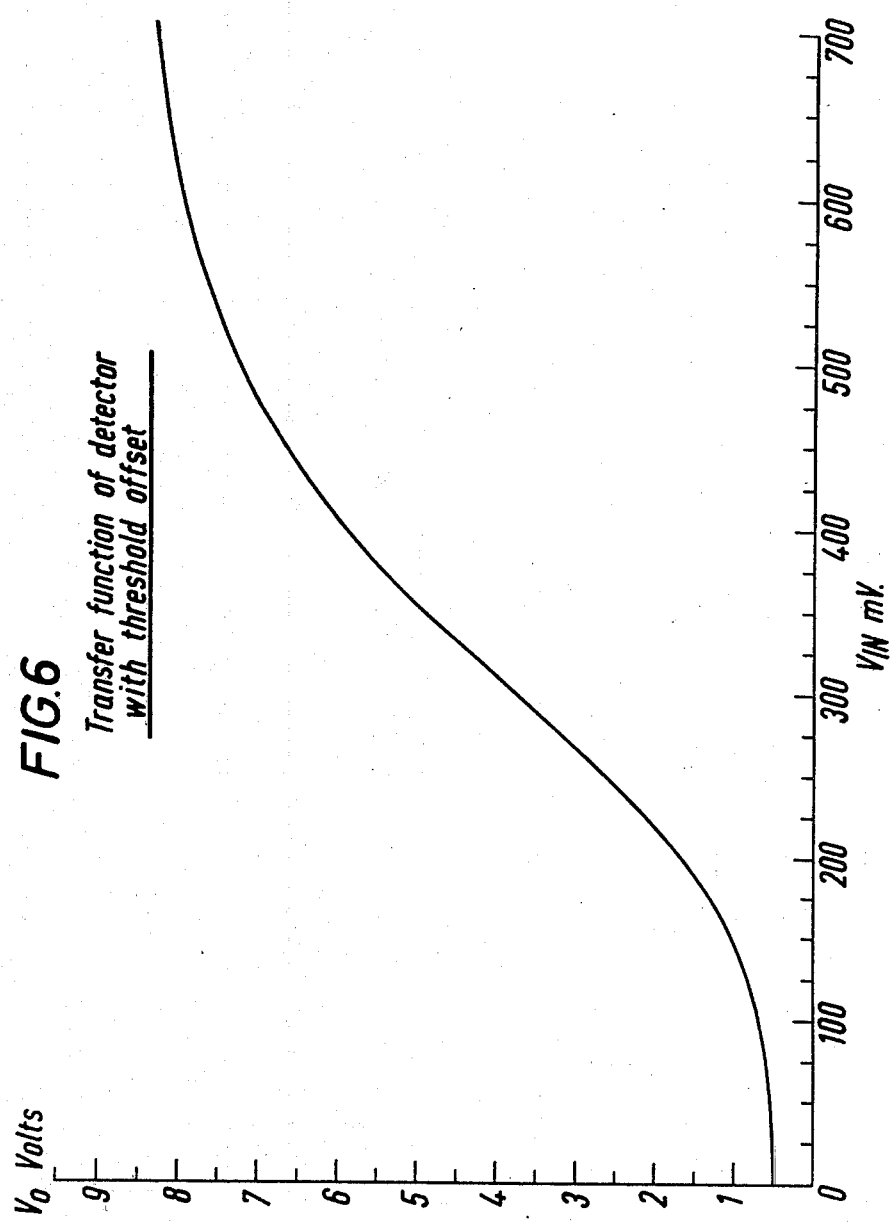
FIG.6 Transfer function of detector with threshold offset

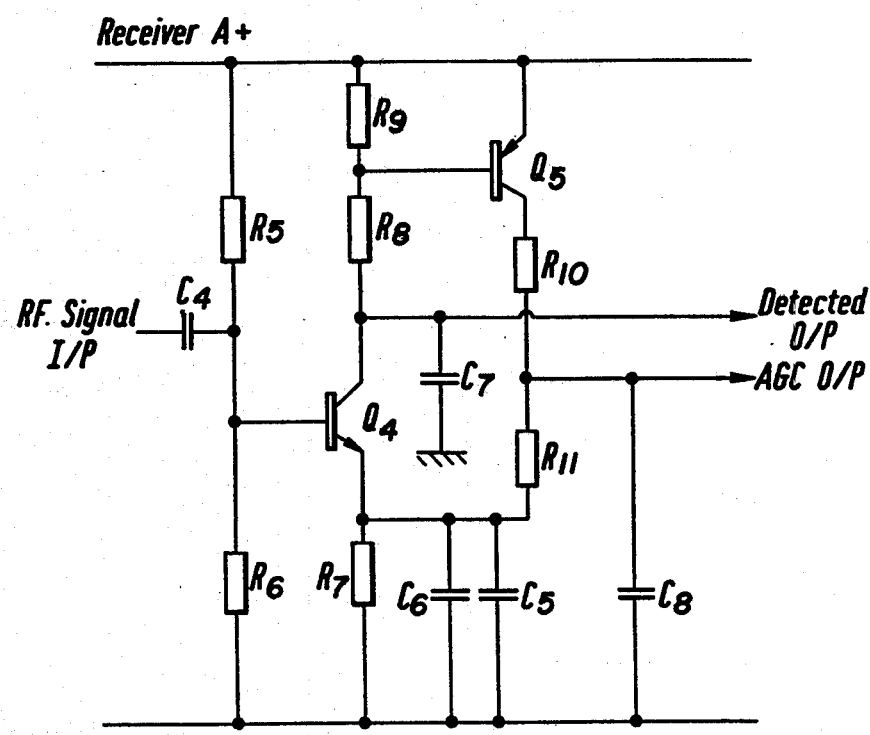
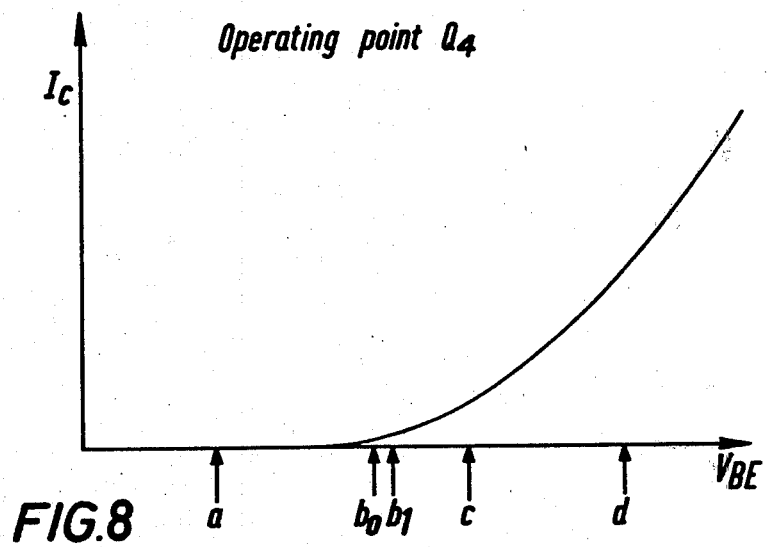

NOISE BLANKING CIRCUITRY IN A RADIO RECEIVER

BACKGROUND OF THE INVENTION

The present invention relates to noise suppression in radio receivers and more particularly to noise blanking circuits with squelch.

Blanking circuits for use in communication radio receivers are well known in the art. Generally, the blanker circuits detect noise signals introduced by the transmitting medium and which are received at the antenna along with transmitted information signals. Several means for detecting the noise have been devised. The detected noise signals are processed whereby a blanking signal is produced which blanks the receiver for the duration of a blanking signal, thus preventing a noise burst from being heard by the listener.

It has been proposed heretofore, to provide in a radio receiver, an RF amplifier stage receiving transmitted radio frequency signals and noise signals from a receiver antenna, the output of the RF amplifier stage being supplied to one input of a mixer stage having a second input supplied with a signal from a local oscillator, the mixer converting the radio frequency signal from the amplifier to an intermediate frequency and supplying the intermediate frequency signal to one input of a blanker gate which receives a blanking signal from a blanking signal source at a second input thereof. The blanker gate in normal operation, passed intermediate frequency signals from the mixer stage to an intermediate frequency filter and amplifier stage, but in response to a blanking signal from the blanking signal source, the blanker gate decouples the mixer from the intermediate frequency filter and amplifier stage. Signals from the IF filter and amplifier stage are detected and demodulated by means of an amplitude limiter and discriminator, into audio signals, and these audio signals are applied via an audio amplifier to a transducer such as a loud speaker.

The audio signal output from the amplitude limiter and discriminator, is applied to a noise squelch circuit which detects noise frequencies above a predetermined frequency. If the noise frequencies exceed a selected amplitude, a squelch signal is generated and supplied from the squelch circuit to the audio amplifier to block or mute the audio signals.

Current FM squelch circuits use peak detectors and no noise blanking, and are susceptible to spiky noise.

SUMMARY OF THE INVENTION

An object of the present invention is to eliminate squelch false muting by blanking pulse spikes and to reduce the susceptibility of false squelching by high peak to average ratio noise.

Another object of the invention is to provide in a squelch circuit, a detector which provides a DC output proportional to the average input voltage waveform envelope.

A further object of the present invention is to stabilize the threshold in a pulse detector thereby eliminating false triggering caused by input noise being detected when the threshold shifts, due to carriers present at the input changing the DC condition. An AGC output is additionally provided.

Thus, according to one aspect of the invention there is provided a radio receiver including means for receiving radio frequency signals, tuner means for processing the received radio signals and producing audio output signals in response thereto, a blanker circuit for detecting noise pulses in the received radio frequency signals and producing blanking pulses for blanking the tuner means in response thereto, an FM squelch circuit responsive to said audio output signals and to noise signals above a predetermined frequency to generate squelch signals when the noise signals exceed a predetermined amplitude to mute said audio signals, and said squelch circuit including a detector responsive to blanking pulses from said blanker circuit to eliminate squelch false muting in response to blanking pulse spikes from the blanker circuit and to reduce the susceptibility of false squelching.

According to a further aspect of the invention there is provided in said squelch circuit of said radio receiver, an averaging detector responsive to noise signals and responsive also to noise blanking signals produced in response to the receipt of radio frequency signals including noise signals, said averaging detector providing a DC output voltage proportional to the average level of the input voltage waveform envelope. The averaging detector forms the subject of co-pending U.S. Patent application Ser. No. 130,931, filed on Mar. 17, 1980, based on United Kingdom priority Application Ser. No. 7,914,883, filed on Apr. 30, 1979.

According to a still further aspect of the invention there is provided in said radio receiver, a pulse detector responsive to radio frequency input signals and including a feedback loop to adjust the DC bias of the detector to compensate for varying signal input levels and to produce an AGC voltage output related to the total carrier level, the detector being rendered immune to false triggering by maintaining the detector threshold. The pulse detector forms the subject of co-pending U.S. patent application Ser. No. 130,932, filed on Mar. 17, 1980, based on United Kingdom priority Application Ser. No. 7,914,882, filed on Apr. 30, 1979.

BRIEF DESCRIPTION OF THE DRAWINGS

The invention will now be described by way of example only with particular reference to the accompanying drawings, wherein:

FIG. 6 is a graph of the transfer function of the averaging detector with threshold offset;

FIG. 7 is a detailed circuit diagram of a tracking pulse detector; and

FIG. 8 is a diagram showing the operating point characteristic of a transistor of the tracking pulse detector of FIG. 7 showing the collector current $I_c$ plotted to a base of base/emitter voltage $V_{BE}$.

DETAILED DESCRIPTION OF THE INVENTION

Figure 1:
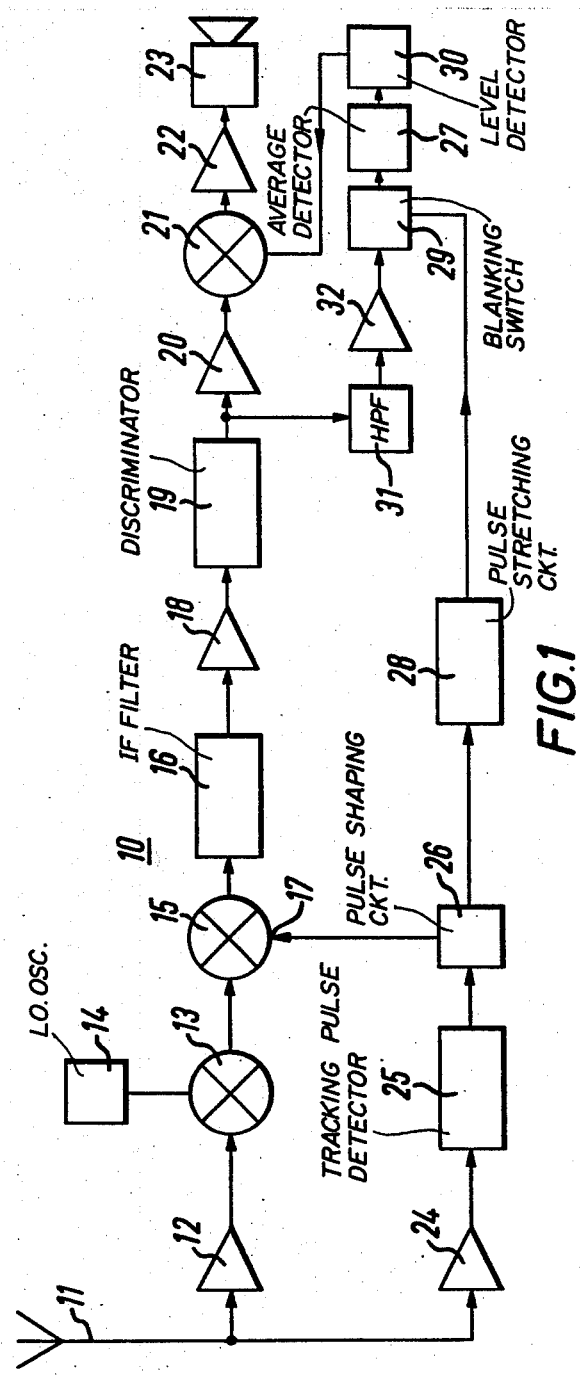
FIG. 1 is a block diagram of a radio receiver circuit showing the pulse detector, FM squelch blanking circuit and the averaging detector of the latter.
Figure 2A:
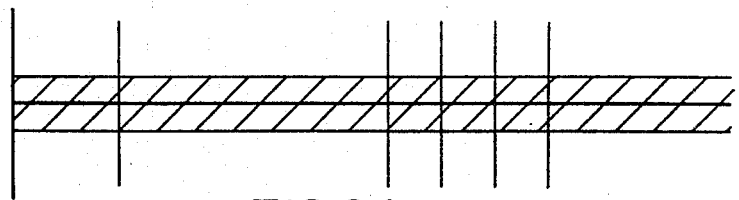
FIGS. 2A to 2K are waveform diagrams of the signals present in the radio receiver circuit of FIG. 1.
Figure 2B:
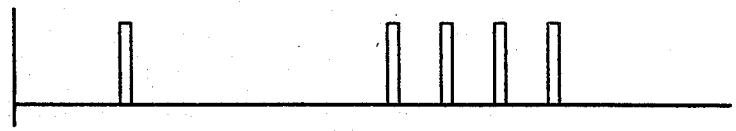
Figure 2C:
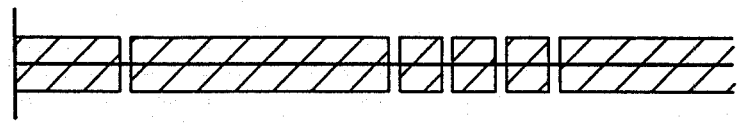
Figure 2D:
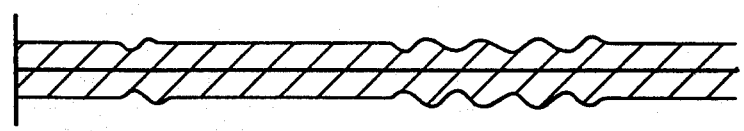
Figure 2E:
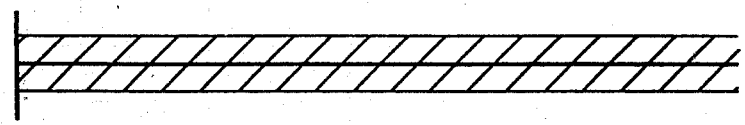
Figure 2F:
Figure 2G:
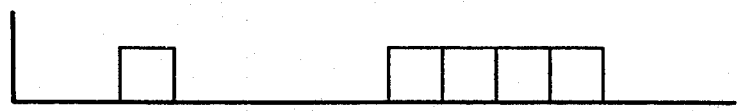
Figure 2H:
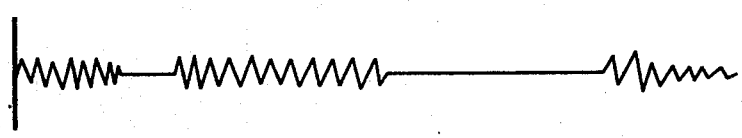
Figure 2I:
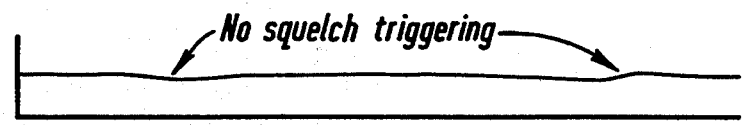
Figure 2J:
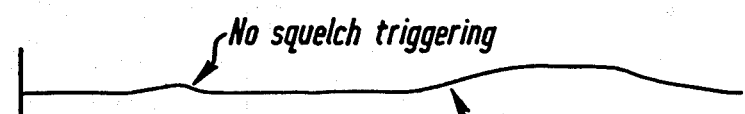
Figure 2K:
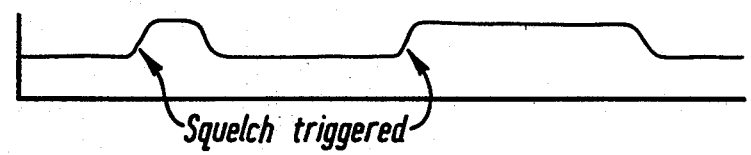

Referring initially to FIG. 1 of the drawings, a frequency modulated radio receiver 10 includes an antenna 11 for receiving transmitted radio frequency signals and noise signals commonly introduced by the transmitting medium. Signals from the antenna are supplied to a radio frequency amplifier stage 12, which generally includes tuning circuitry for tuning the receiver to an appropriate channel or station. The output of a radio frequency amplifier 12 is supplied to one input of a mixer stage 13, a signal from a local oscillator 14 being applied to a second input of the mixer stage 13. The mixer 13 converts the received radio frequency signal from radio frequency amplifier 12 to an intermediate frequency. A blanker gate 15 couples the output of the mixer 13 to the input of an intermediate frequency filter 16. The blanker gate 15 normally passes intermediate frequency signals from the mixer 13 to the intermediate frequency filter 16, but in response to a blanking signal applied to input 17 of the blanker gate, the gate 15 decouples the mixer 13 from the intermediate frequency filter stage 16, thereby blanking the receiver. Signals from the intermediate frequency filter 16 are supplied to an intermediate frequency amplifier and limiter stage 18, the output of which is connected to the input of a discriminator 19 where the signals are demodulated to audio signals and applied to the input of audio amplifier 20. The amplified audio signals are applied to one input of a further gating device 21, the output of which is connected via a further audio amplifier stage 22 to a loudspeaker 23 where the signals are transduced to audibility.

The incoming signals at antenna 11 are also supplied to a second radio frequency amplifier 24 which forms the input to the blanking pulse generating circuit. This circuit includes a pulse detector 25 responsive to transmitted radio frequency signals and noise signals from amplifier 24 and which detects any pulses present above a predetermined threshold level. These pulses are passed to pulse shaper circuit 26 where a blanking pulse is shaped for application to the second input 17 of blanker gate 15.

The use of a noise blanker circuit comprising pulse detector 25 and pulse shaper 26 to generate blanking pulses to blank impulsive noise gives rise to audio inputs at frequencies corresponding to the passband limits of the intermediate frequency filter 16 where rapid phase-/amplitude change is occurring. These are higher audio frequencies and are detected by the frequency modulation squelch circuit shown in FIG. 1. In general these frequencies occur as random ringing at the IF limit frequency. By including in the FM squelch circuit, an averaging detector 27, rather than a peak detector, some advantage is achieved since the high peak output following the blanking pulse is averaged. This delays the FM squelch lock up by such ringing until a higher repetition rate is reached. In order to eliminate FM squelch lock up, it is necessary to blank the FM squelch detector for the duration of the ring. This is achieved by means of the averaging detector circuit shown in FIG. 3.

In FIG. 1, the blanking pulse from the output of pulse shaper 26 is applied via a pulse stretching circuit 28 to one input of a blanking switch 29 whose output is connected to the input of the averaging detector 27, the output of which is applied via level detector 30 and one input of audio switch 21 to the input of audio frequency amplifier stage 22. The output of discriminator 19 is connected to the second input of blanking switch 29 via high pass filter 31 and noise amplifier 32.

Referring to FIG. 2, waveform A represents impulsive noise on the carrier which is required to be blanked, waveform B represents the blanking pulses applied at input 17 of blanker gate 15, waveform C represents the input signals applied to IF filter 16 and the output from filter 16 which is a hybrid of AM and FM signals is shown at D. The output from the amplitude limiter 18 is shown at E from which it is seen that FM ringing remains. The output signals from the discriminator 19 are shown at F. Blanking pulses stretched after passing through pulse stretcher 28 and applied to the FM squelch detector circuit are shown at G and waveform H represents the squelch detector input after blanking. The output from the blanked FM squelch detector to eliminate lock up is shown at I and is compared with the waveform (2J) of an unblanked averaging detector 27 and the output waveform (2K) from an unblanked peak detector. Waveforms 2A to 2I are also indicated at the appropriate stages of the radio receiver circuit of FIG. 1.

Figure 3:
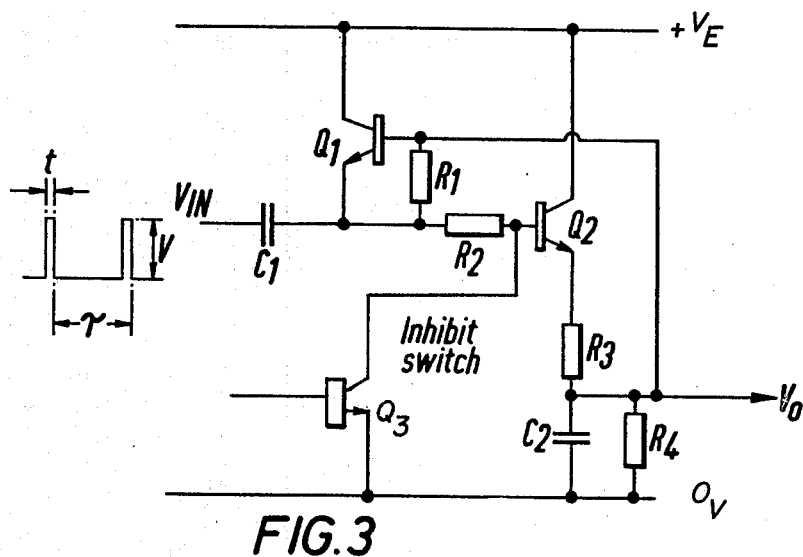
FIG. 3 is a detailed circuit of the averaging detector of FIG. 1.

Referring to FIG. 3, the averaging detector 27 comprises an NPN transistor $Q_1$, and capacitor $C_1$ being connected in the $V_{IN}$ line and resistor $R_1$ being connected across the base and emitter of transistor $Q_1$. A resistor $R_2$ is connected in series with capacitor $C_1$ and to the base of a further NPN transistor $Q_2$. The collectors of transistors $Q_1$, $Q_2$ are connected to the +ve line and the base of transistor $Q_1$ is also connected to the output voltage line $V_o$. The emitter of transistor $Q_2$ is connected via resistor $R_3$ to the output voltage line $V_o$ and capacitor $C_2$ and resistor $R_4$ are connected in parallel between the 0V line and the line $V_o$. An inhibit switch comprising a further NPN transistor $Q_3$ is connected between the base of transistor $Q_2$ and the 0V line, and this is used for blanking, as described hereafter.

With the circuit in the quiescent state i.e. $V_o=0$, on application of a voltage greater than the threshold voltage 2 $V_{BE}$, the first positive going cycle of $V_{IN}$, reverse biases transistor $Q_1$ and forward biases transistor $Q_2$. The impedance seen by capacitor $C_1$ is high and mainly that of resistor $R_1$ and the full positive swing available is followed by the emitter of transistor $Q_2$ to charge capacitor $C_2$ through resistor $R_3$ forming a rectified average. As $V_{IN}$ goes negative, transistor $Q_2$ is reverse biased at a higher voltage than it became forward biased in the previous cycle due to the charging of capacitor $C_2$. Also transistor $Q_1$ becomes forward biased at a higher voltage for the same reason. When transistor $Q_1$ is forward biased, capacitor $C_1$ sees a very low impedance and becomes charged to a potential difference equal to $V_o$. The next positive going cycle of $V_{IN}$ has a positive DC shift equal to $V_o$. This causes transistor $Q_2$ to become forward biased in the same way as the first cycle but offset. Capacitor $C_2$ receives a further charge and on the negative cycle of $V_{IN}$, transistor $Q_1$ becomes forward biased and charges up capacitor $C_1$. This process is repeated until a balance is reached between the half cycle charging through resistor $R_3$ and the continuous discharge through resistor $R_4$.

The circuit described above is an averaging detector and can be used as the detector in FM squelch, where it exhibits greater immunity to very short duration spikes or bursts, than a peak detector. However, the averaging detector has application in circuits other than the radio receiver circuit of the present invention and could be used as an AGC detector or as an AM detector. As previously indicated, the averaging detector forms the subject of above-mentioned U.S. co-pending patent application Ser. No. 130,931.

Figure 5:
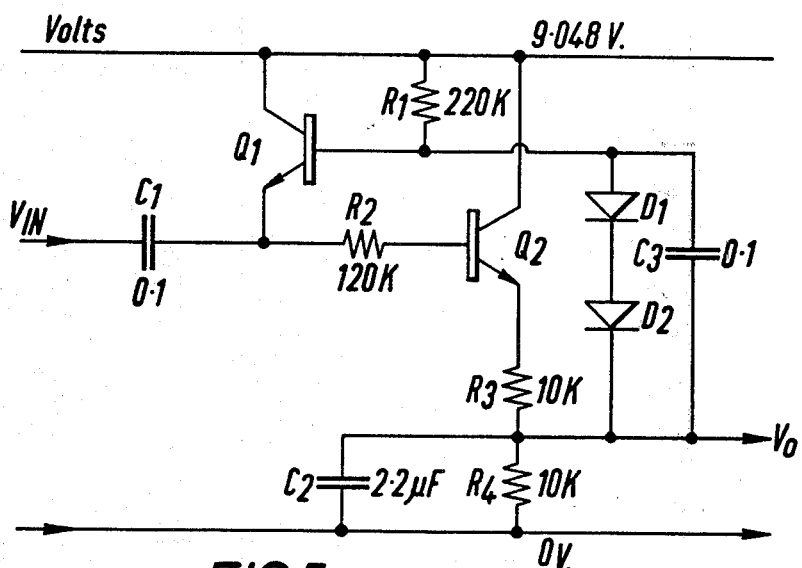
FIG. 5 is a detailed circuit diagram of a modified averaging detector with threshold voltage reduction.
Figure 4A:
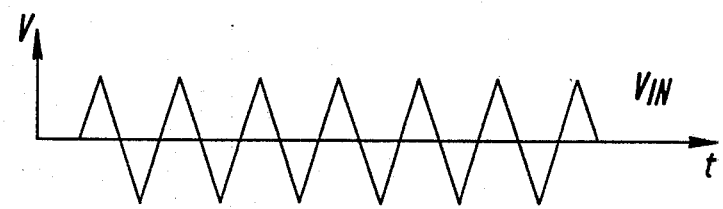
FIGS. 4A to 4D are waveform diagrams of the signals present in the averaging detector of FIG. 3.
Figure 4B:
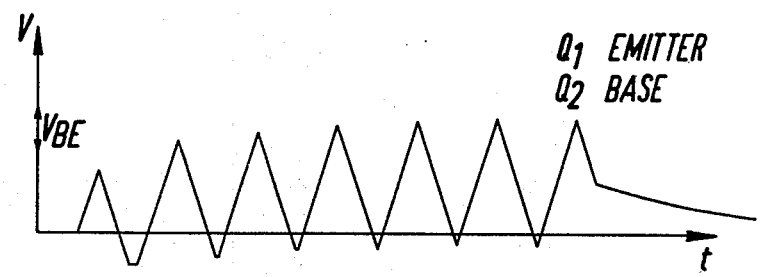
Figure 4C:
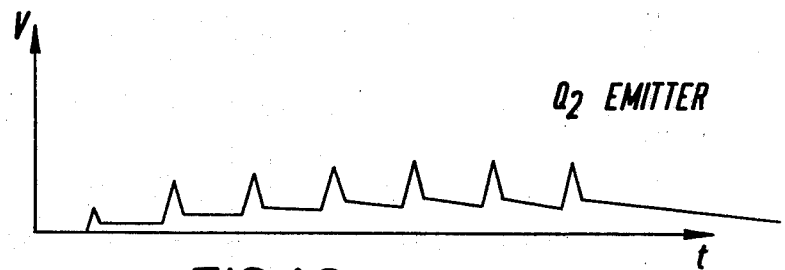
Figure 4D:
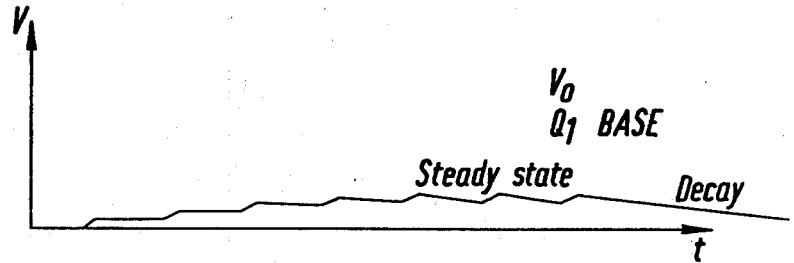

In the modification of the circuit of FIG. 3, the threshold voltage can be reduced by offsetting the voltage on the base of transistor $Q_1$ by up to 2 $V_{BE}$ above 0. One method, using a pair of forward biased diodes, is shown in FIG. 5. In this circuit resistor $R_1$ is connected between the base and collector of transistor $Q_1$ and a pair of forward biased diodes $D_1$, $D_2$, are connected between the base of transistor $Q_1$ and output line $V_o$, a capacitor $C_3$ being connected across diodes $D_1$, $D_2$.

The inhibit switching transistor $Q_3$ grounds the base of transistor $Q_2$, to eliminate FM squelch lock for the duration of the random ringing occurring at the IF limit frequency, the transistor $Q_3$ being turned on during and for a short time after the IF blanking pulse.

It should be noted that resistor $R_2$ is not an essential part of the circuit of FIG. 5, except when it is blanked by grounding the base of transistor $Q_2$. Resistor $R_2$ then prevents overload of transistor $Q_1$. Resistor $R_1$ defines with the transistor $Q_2$ input impedance, the input time constant. Capacitor $C_1$ should not approach the value of capacitor $C_2$ to maintain small charging currents in transistor $Q_1$.

The present invention also provides a tracking pulse detector as the detector 25 of FIG. 1 and which is immune to false triggering caused by input noise being detected when the threshold shifts due to carriers present at the input changing the DC condition.

The tracking pulse detector is operated at a low current in a feedback loop. The average current in the detector is kept approximately constant independent of supply and signal conditions. The feedback loop adjusts the detector DC bias to compensate for varying signal levels. Noise present at the input is thus kept below the detector threshold independent of the level of slow varying carriers. Any carrier level variation faster than the feedback loop time constants are detected. An AGC voltage related to total carrier level is produced. The tracking pulse detector forms the subject of the copending patent application Ser. No. 130,932 filed Mar. 17, 1980, but is applicable to the radio receiver circuit of FIG. 1.

Referring to FIG. 7 the RF signals from the RF amplifier receiving signals from the antenna are applied to the base of transistor $Q_4$ via capacitor $C_4$, a voltage divider comprising series resistors $R_5$, $R_6$ being connected to the base of transistor $Q_4$ and between the positive and OV lines. The emitter of transistor $Q_4$ is connected to the OV line via resistor $R_7$ which is connected in parallel with capacitors $C_5$, $C_6$. A fourth capacitor $C_7$ is connected between the collector of transistor $Q_4$ and ground. Resistor $R_8$ which in current detectors is connected to the collector of transistor $Q_4$, is connected in the detector of the present invention, between the collector of transistor $Q_4$ and the base of a second transistor $Q_5$ and in series with resistor $R_9$ to form a voltage divider. Voltage divider resistors $R_{10}$, $R_{11}$ are connected in series between the collector of transistor $Q_5$ and the emitter of transistor $Q_4$, the transistor $Q_5$ and resistor $R_{10}$, $R_{11}$ forming the aforementioned feedback loop. The emitter of transistor $Q_5$ is connected to the positive line and the AGC output is taken from the junction between resistors $R_{10}$, $R_{11}$, a further capacitor $C_8$ being connected between the AGC output line and the OV line.

In the quiescent state of the detector, transistor $Q_4$ is forward biased by voltage divider chain $R_5$, $R_6$ and causes current to flow through resistor $R_8$ and the base of transistor $Q_5$. Transistor $Q_5$ amplifies this base current and increases the voltage across resistor $R_7$ which increases the voltage on the emitter of transistor $Q_4$, and hence reduces the forward bias of transistor $Q_4$. The current in transistor $Q_4$ diminishes until a balance point is reached such that transistor $Q_4$ is passing the small base current of transistor $Q_5$, plus the current in resistor $R_9$ which after amplification by transistor $Q_5$ is providing the bias across resistor $R_7$. This provides automatic setting of transistor $Q_4$, at the bias point required to provide detection, i.e. just forward biased.

For detection, when a burst of RF is applied to the base of transistor $Q_4$, positive going cycles cause the collector current to decrease the potential on capacitor $C_8$ whilst negative going cycles reverse bias transistor $Q_4$ ($R_8C_7 << YRF$). The bias on the emitter of transistor $Q_4$ remains fixed due to the long time constants of resistors $R_{10}$, $R_{11}$ and capacitor $C_8$ and resistor $R_7$ and capacitors $C_6$, $C_5$. A negative going envelope is thus produced across capacitor $C_7$.

When a steady carrier or continuous noise is impressed on the base of transistor $Q_4$, the current through resistor $R_8$ increases and after the time required by time constants $R_{10}$, $R_{11}$, $C_8$; $R_7$, $C_5$, $C_6$; the bias on the emitter of transistor $Q_4$ is raised to bias transistor $Q_4$ such that only the peaks of the input are detected by transistor $Q_4$ to provide the new bias current in transistor $Q_5$. This corresponds to a small change in DC voltage on capacitor $C_7$. Additionally, the bias change required to adjust transistor $Q_4$ to detection of wave peaks, is reflected as an amplified shift in the DC voltage on capacitor $C_8$. This is the AGC output.

Transistor $Q_4$ is now operating at a slightly larger bias but still is essentially just forward biased and hence can detect any rapid increase in carrier level i.e. an impulsive noise burst.

The bias point required by the detector is just forward biased. If the detector is operated reverse biased, it exhibits a threshold and is hence less sensitive. If the detector is operated well forward biased, it no longer detects, but acts as an amplifier and low pass filter with no detection characteristic. If a carrier were allowed to shift the detector's operating point towards well forward biased, it would first detect the noise present alongside the carrier as a slight modulation i.e. it would have no noise threshold protection, and eventually would be desensitized by the forward biasing.

In a noise blanker radio, the effect of bias point shift due to a carrier allowing the noise to appear as a modulation output, is called false noise triggering and can send a noise blanker radio into rate shut off as the noise bandwidth is of the order of hundreds of kilohertz. As shown in FIG. 8, where the collector current of transistor $Q_4$ is plotted to a base of the potential between the base and emitter electrodes thereof, when the detector is reverse biased, a large threshold is exhibited as shown at (a). As shown at ($b_o$) in the quiescent state, the detector exhibits low gain to small excursions (noise). A shift in the operating point to ($b_l$) in the presence of a carrier with the tracking detector of the present invention still provides low gain to small excursions (noise). At point (c) there is considerable gain to noise for a non-tracking detector and hence noise is seen by subsequent stages and causes false triggering. The characteristic at point (d) shows the detector desensitized i.e. no longer operating as a detector in the presence of a large carrier.

The base of transistor $Q_5$ may be additionally utilized to provide a gain control point for IM protection and level shut off from the main receiver but this feature is not illustrated in FIG. 7.

It will be appreciated that the invention is susceptible to considerable modification and is not to be deemed limited to the particular circuit details described by way of example only.

I claim:

1. A radio receiver including means for receiving radio frequency signals, tuner means for processing the received radio signals and producing audio output signals in response thereto, a blanker circuit for detecting noise pulses in the received radio frequency signals and producing blanking pulses for blanking the tuner means in response thereto, an FM squelch circuit responsive to said audio output signals and to noise signals above a predetermined frequency to generate squelch signals when the noise signals exceed a predetermined amplitude to mute said audio signals, and said squelch circuit including a detector responsive to blanking pulses from said FM blanker circuit for eliminating squelch false muting of the receiver by the FM squelch circuit in response to blanking pulse spikes from the blanker circuit and thereby reducing the susceptibility of false squelching said tuner means further includes a discrimination and an averaging detector responsive to noise signals and responsive also to noise blanking signals produced in response to the receipt of radio frequency signals including noise signals, said averaging detector providing a DC output voltage proportional to the average level of the voltage waveform envelope developed at its input by the discriminator.

2. A radio receiver as claimed in claim 1 including a tracking pulse detector responsive to radio frequency input signals and a feedback loop to adjust the DC bias of the tracking pulse detector to compensate for varying signal input levels and to produce an AGC voltage output related to the total carrier level, the tracking pulse detector being rendered immune to false triggering by maintaining the tracking pulse detector threshold.

3. A radio receiver as claimed in claim 1 including means for converting received radio frequency signals to intermediate frequency signals, a blanker gate responsive to said intermediate frequency signals and to said blanking pulses and normally passing said intermediate frequency signals to discriminator means for demodulating the intermediate frequency signals to audio signals unless a blanking pulse is supplied to said blanker gate, a blanking switch included in said squelch circuit and responsive to blanking pulses and to output signals from said discriminator means, and output signals from said blanking switch being supplied via an averaging detector to one input of further gating means arranged to receive output signals from said discriminator means, the averaging detector averaging the high peak output following a blanking pulse to eliminate FM squelch lock-up.

4. A radio receiver as claimed in claim 3 wherein the blanking signal generating circuit includes a pulse detector coupling to a pulse shaper, output signals of said pulse shaper are applied to one input of said blanker gate and via a pulse stretching circuit to one input of the blanking switch.

5. A radio receiver as claimed in claim 3 wherein said averaging detector comprises a first transistor having a first resistor connected across the base and emitter thereof, a first capacitor connected in a signal input line and to the base of a second transistor, the collectors of the first and second transistors being connected to a positive voltage line and the base of the first transistor being connected to an output voltage line together with the emitter of the second transistor, via a second resistor, an inhibit switch being connected between the base of the second transistor and a zero voltage line, a third resistor and second capacitor being connected in parallel between the zero voltage line and the output voltage line, the arrangement being such that upon application of a voltage greater than the threshold voltage of the first transistor, successive positive and negative going cycles alternately reverse bias and forward bias the first and second transistors to achieve a balance between the half cycle charging through the second resistor and the continuous discharge through the third resistor to eliminate short duration spikes in the FM squelch circuit.

6. A radio receiver as claimed in claim 5 wherein said inhibit switch comprises a third transistor.

7. A radio receiver as claimed in claim 3 wherein said averaging detector comprises a first transistor having a first resistor connected between the base and a positive voltage line, a first capacitor connected in a signal input line and to the base of a second transistor, the collectors of the first and second transistors being connected to a positive voltage line, a second resistor and second capacitor being connected in parallel between an output voltage line and a zero voltage line, and the base of the first transistor being connected to the output voltage line via a pair of forward biased diodes connected in parallel with a third capacitor, together with the emitter of the second transistor via a third resistor, the threshold voltage of the first transistor being reduced by offsetting the voltage on the base thereof and the first and second transistors being alternately reverse biased and forward biased on successive positive and negative going cycles to achieve a balance between the half cycle charging through the third resistor and the continuous discharge through the second resistor to eliminate short duration spikes in the FM squelch circuit.

8. A radio receiver as claimed in claim 2 wherein the tracking pulse detector comprises a first transistor having radio frequency input signals applied to the base thereof via a first capacitor, a first voltage divider being connected to the base of the first transistor and between positive and zero voltage lines, the emitter of the first transistor being connected to the zero voltage line via resistive-capacitive means, a resistor connected between the collector of the first transistor and the base of a second transistor and in series with a further resistor to form a second voltage divider, and a third voltage divider connected between the collector of the second transistor and the emitter of the first transistor, the second transistor and third voltage divider forming said feedback loop.

9. A radio receiver as claimed in claim 8 wherein the emitter of the second transistor is connected to the positive voltage line and the AGC output is taken from the junction between the resistors of said third voltage divider.

* * * * *